(12) United States Patent
Huang et al.

(10) Patent No.: US 11,996,411 B2
(45) Date of Patent: May 28, 2024

(54) STACKED FORKSHEET TRANSISTORS

(71) Applicant: Intel Corporation, Santa Clara, CA (US)

(72) Inventors: Cheng-Ying Huang, Portland, OR (US); Gilbert Dewey, Beaverton, OR (US); Anh Phan, Beaverton, OR (US); Nicole K. Thomas, Portland, OR (US); Urusa Alaan, Hillsboro, OR (US); Seung Hoon Sung, Portland, OR (US); Christopher M. Neumann, Portland, OR (US); Willy Rachmady, Beaverton, OR (US); Patrick Morrow, Portland, OR (US); Hui Jae Yoo, Portland, OR (US); Richard E. Schenker, Portland, OR (US); Marko Radosavljevic, Portland, OR (US); Jack T. Kavalieros, Portland, OR (US); Ehren Mannebach, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 825 days.

(21) Appl. No.: 16/913,796

(22) Filed: Jun. 26, 2020

(65) Prior Publication Data

US 2021/0407999 A1 Dec. 30, 2021

(51) Int. Cl.
*H01L 29/78* (2006.01)
*H01L 27/092* (2006.01)
*H01L 29/06* (2006.01)
*H01L 29/423* (2006.01)
*H01L 29/775* (2006.01)
*H10B 12/00* (2023.01)

(52) U.S. Cl.
CPC ...... *H01L 27/0924* (2013.01); *H01L 29/0673* (2013.01); *H01L 29/4232* (2013.01); *H01L 29/775* (2013.01); *H01L 29/7851* (2013.01); *H10B 12/056* (2023.02)

(58) Field of Classification Search
CPC ............ H01L 27/0924; H01L 27/0688; H01L 27/092; H01L 27/0886; H01L 29/0673; H01L 29/4232; H01L 29/775; H01L 29/7851; H01L 29/0847; H01L 29/42392; H01L 29/66439; H01L 29/78696; H01L 27/7853; H10B 12/056
See application file for complete search history.

(56) References Cited

U.S. PATENT DOCUMENTS 11,069,820 B2 * 7/2021 Jo ................... H01L 21/823431
2011/0031473 A1 * 2/2011 Chang ................... H10B 10/12
257/E27.098

(Continued)

*Primary Examiner* — Ida M Soward
(74) *Attorney, Agent, or Firm* — Schwabe, Williamson & Wyatt, P.C.

(57) ABSTRACT

Embodiments disclosed herein include stacked forksheet transistor devices, and methods of fabricating stacked forksheet transistor devices. In an example, an integrated circuit structure includes a backbone. A first transistor device includes a first vertical stack of semiconductor channels adjacent to an edge of the backbone. A second transistor device includes a second vertical stack of semiconductor channels adjacent to the edge of the backbone. The second transistor device is stacked on the first transistor device.

21 Claims, 10 Drawing Sheets

(56) References Cited

U.S. PATENT DOCUMENTS

| | | | |
|---|---|---|---|
| 2013/0161756 A1* | 6/2013 | Glass | H01L 29/42392 |
| | | | 257/E21.632 |
| 2015/0263088 A1* | 9/2015 | Cheng | H01L 21/84 |
| | | | 438/283 |
| 2016/0163796 A1* | 6/2016 | Obradovic | H01L 29/785 |
| | | | 257/9 |
| 2018/0090624 A1* | 3/2018 | Cheng | H01L 29/78687 |
| 2018/0114833 A1* | 4/2018 | Bao | B82Y 10/00 |
| 2020/0075770 A1* | 3/2020 | Kobrinsky | H01L 21/823475 |
| 2020/0098756 A1* | 3/2020 | Lilak | H01L 29/78696 |
| 2020/0098757 A1* | 3/2020 | Rachmady | H01L 29/66742 |
| 2020/0105756 A1* | 4/2020 | Crum | H01L 29/42392 |
| 2021/0210489 A1* | 7/2021 | Zhang | H01L 27/0924 |
| 2021/0358911 A1* | 11/2021 | Zhang | H01L 29/775 |

\* cited by examiner

STACKED FORKSHEET TRANSISTORS

TECHNICAL FIELD

Embodiments of the present disclosure relate to integrated circuit structures, and more particularly to stacked forksheet transistors for use in integrated circuitry.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

EMBODIMENTS OF THE PRESENT DISCLOSURE

Figure 1A:
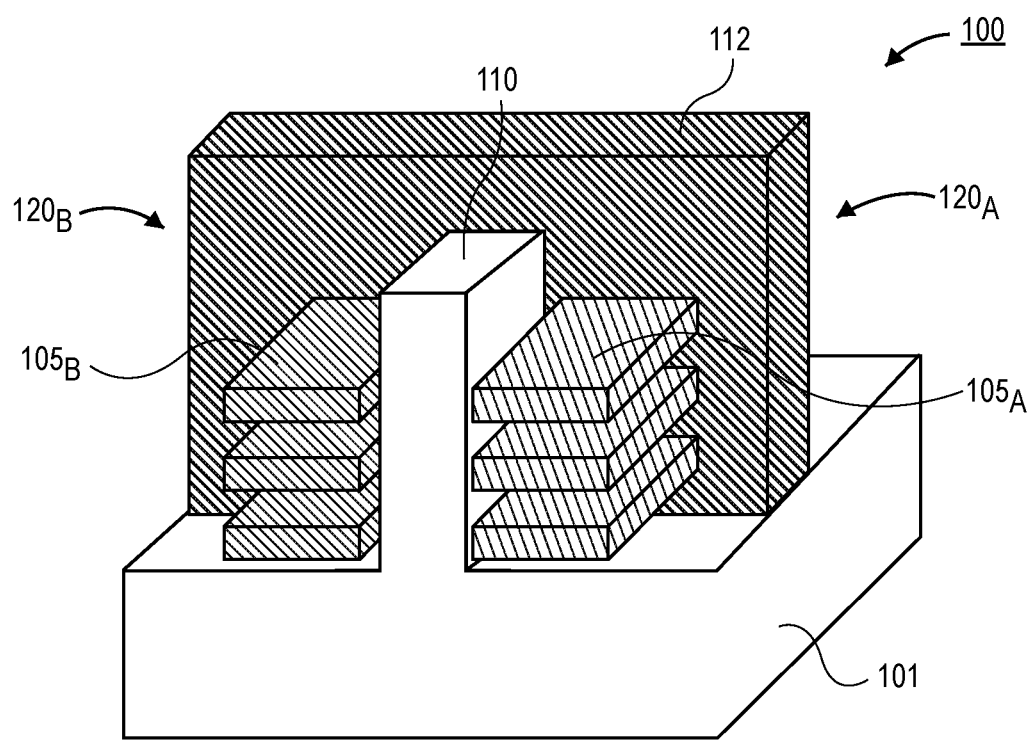
FIG. 1A is a perspective view illustration of forksheet transistors, in accordance with an embodiment.

Described herein are stacked forksheet transistors, and methods of fabricating stacked forksheet transistors. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled." The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit." As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

One or more embodiments described herein are directed to stacking of forksheet (or nanocomb) transistors. One or more embodiments described herein are directed to stacking of forksheet transistors to form three-dimensional (3-D) stacked CMOS architecture.

In accordance with one or more embodiments of the present disclosure, a shared-gate self-aligned stacked transistor architecture is described, e.g., for extending Moore's Law beyond 3 nm generations. By stacking transistors directly on top of one another, 3-D CMOS architecture enables a smaller cell size and lower RC delay as compared with conventional 2-D CMOS. In addition, a nano-comb (or forksheet) transistor architecture can be implemented for cell height scaling by using nanowire or nanoribbon transistors combined with a self-aligned dielectric wall to reduce the spacing at an NMOS and PMOS boundary. The combination of shared-gate stacked nanoribbon transistors with a self-aligned dielectric wall can eventually lead to an ultimately scaled 3-D stacked nanocomb (forksheet) CMOS architecture. Described herein are key features and a process flow for fabricating a stacked nano-comb transistor architecture with a self-aligned dielectric wall.

To provide context, to continue cell size scaling, nanowires/nanoribbons, self-aligned dielectric wall (or self-aligned gate end, SAGE), and stacked transistors are three feasible boosters to continue cell size scaling. Unlike FinFETs, nanowire or nanoribbon structure allows higher drive current per footprint because of its stackability. A self-aligned gate end (SAGE) uses a dielectric wall to separate NMOS and PMOS, thus reducing the gate extension over active fins and the spacing of N-P boundary. Nanocomb transistor architecture combines both nanoribbon channels with a self-aligned dielectric wall to aggressively scale the cell height in a 2-D CMOS. As 2-D CMOS approaches its scaling limit, going to 3-D becomes very important. In an embodiment, fabricating 3-D stacked transistors, either NMOS-on-PMOS or PMOS-on-NMOS, is a key booster to continuously scale the cell size. In one embodiment, to achieve the most benefits of area scaling for 3-D CMOS, nanoribbons and self-align dielectric wall are implemented in a 3-D architecture to fabricate a 3-D stacked forksheet or nanocomb CMOS architecture.

To provide further context, in order to combat the demands of spacing between features, a forksheet transistor architecture has been proposed. In a forksheet architecture, an insulating backbone is disposed between a first transistor and a second transistor. The semiconductor channels (e.g., ribbons, wires, etc.) of the first transistor and the second transistor contact opposite sidewalls of the backbone. As such, the spacing between the first transistor and the second transistor is reduced to the width of the backbone. Since one surface of the semiconductor channels contacts the backbone, such architectures do not allow for gate all around (GAA) control of the semiconductor channels. Additionally, compact interconnect architectures between the first transistor and the second transistor have yet to be proposed.

As noted above, forksheet transistors allow for increased density of non-planar transistor devices. An example of semiconductor device 100 with forksheet transistors $120_A$ and $120_E$ is shown in FIG. 1A. A forksheet transistor includes a backbone 110 that extends up from a substrate 101 with a transistor 120 adjacent to the either sidewall of the backbone 110. As such, the spacing between transistors $120_A$ and $120_E$ is equal to the width of the backbone 110. Therefore, the density of such forksheet transistors 120 can be increased compared to other non-planar transistor architectures (e.g., fin-FETs, nanowire transistors, etc.).

Sheets 105 of semiconductor material extend away (laterally) from the backbone 110. In the illustration of FIG. 1A, sheets $105_A$ and $105_E$ are shown on either side of the backbone 110. The sheets $105_A$ are for the first transistor $120_A$ and the sheets $105_E$ are for the second transistor $120_B$. The sheets $105_A$ and $105_E$ pass through a gate structure 112. The portions of the sheets $105_A$ and $105_E$ within the gate structure 112 are considered the channel, and the portions of the sheets $105_A$ and $105_E$ on opposite sides of the gate structure 112 are considered source/drain regions. In some implementations, the source/drain regions include an epitaxially grown semiconductor body, and the sheets 105 may only be present within the gate structure 112. That is, the stacked sheets $105_A$ and $105_E$ are replaced with a block of semiconductor material.

Figure 1B:
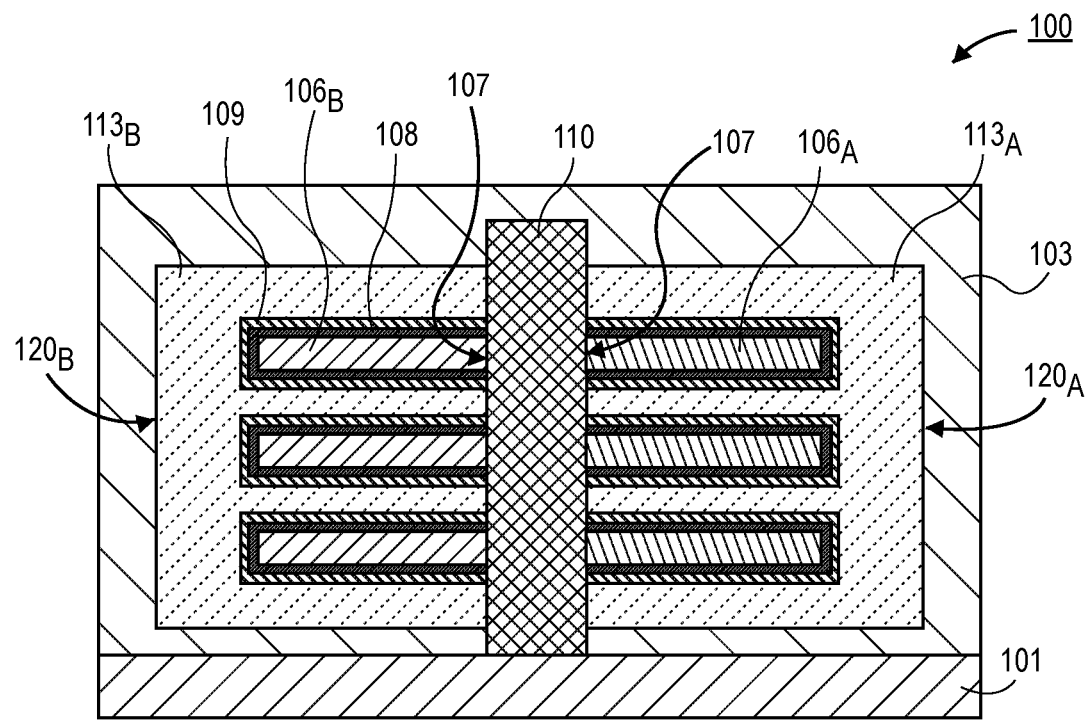
FIG. 1B is a cross-sectional illustration of forksheet transistors across the semiconductor channels, in accordance with an embodiment.

Referring now to FIG. 1B, a cross-sectional illustration of the semiconductor device 100 through the gate structure 112 is shown. As shown, vertical stacks of semiconductor channels $106_A$ and $106_E$ are provided through the gate structure 112. The semiconductor channels $106_A$ and $106_E$ are connected out of the plane of FIG. 1B to the source/drain regions. The semiconductor channels $106_A$ and $106_E$ are surrounded on three sides by a gate dielectric 108. The surfaces 107 of the semiconductor channels $106_A$ and $106_E$ are in direct contact with the backbone 110. A workfunction metal 109 may surround the gate dielectric 108, and a gate fill metal $113_A$ and $113_E$ may surround the workfunction metal 109. In the illustration, the semiconductor channels $106_A$ and $106_E$ are shown as having different shading. However, in some implementations, the semiconductor channels $106_A$ and $106_E$ may be the same material. An insulator layer 103 may be disposed over the gate fill metals $113_A$ and $113_B$.

While such forksheet transistors $120_A$ and $120_E$ provide many benefits, there are still many areas for improvement in order to provide higher densities, improved interconnection architectures, and improved performance. For example, embodiments disclosed herein provide further density improvements by stacking a plurality of transistor strata over each other. Whereas the semiconductor device 100 in FIGS. 1A and 1B illustrate a single strata (i.e., a pair of adjacent forksheet transistors $120_A$ and $120_B$), embodiments disclosed herein include a first strata and a second strata (e.g., to provide four forksheet transistors) within the same footprint illustrated in FIGS. 1A and 1B. Additionally, embodiments disclosed herein provide interconnect architectures that allow for electrical coupling between the first strata and the second strata to effectively utilize the multiple strata. Additionally, embodiments disclosed herein include interconnect architectures that allow for bottom side connections to the buried strata.

In an embodiment a material for a backbone may be composed of a material suitable to ultimately electrically isolate, or contribute to the isolation of, active regions of neighboring transistor devices. For example, in one embodiment, a backbone is composed of a dielectric material such as, but not limited to, silicon dioxide, silicon oxy-nitride, silicon nitride, or carbon-doped silicon nitride. In an embodiments, a backbone is composed of or includes a dielectric such as an oxide of silicon (e.g., silicon dioxide ($SiO_2$)), a doped oxide of silicon, a fluorinated oxide of silicon, a carbon doped oxide of silicon, a low-k dielectric material known in the art, and combinations thereof. The backbone material may be formed by a technique, such as, for example, chemical vapor deposition (CVD), physical vapor deposition (PVD), or by other deposition methods.

In accordance with one or more embodiments of the present disclosure, shared-gate, stacked nanoribbon transistors are combined with a self-aligned dielectric wall. Described below are key features and a process flow for fabricating a stacked nano-comb transistor architecture. Embodiments include new transistor architectures, which can achieve an ultimately scaled 3-D CMOS by combining nanoribbons, self-aligned gate end, and shared-gate stacked transistors.

In an embodiment one or more of the following features may be implemented or achieved: (1) multi nanoribbons stacked transistors with one end of the ribbons in contact with the dielectric wall; (2) a self-aligned dielectric wall with a possible metal routing in the dielectric wall; (3) stacked dual metal gate process to provide different Vt for NMOS and PMOS; (4) stacked dual epitaxial (EPI) process to provide different source or drain materials for NMOS and PMOS; (5) 3-D CMOS with front-side and back-side interconnect; (6) an isolation oxide may be included in a gate electrode to separate N-workfunction metal (WFM) and P-WFM; (7) an isolation oxide may be included in a contact electrode to separate NMOS and PMOS EPI source or drain (S/D), and separate the top contact and the bottom contact as well; and/or (8) an EPI to EPI N-P via may be included to connect a top transistor to a bottom transistor and form a common drain.

Figure 2:
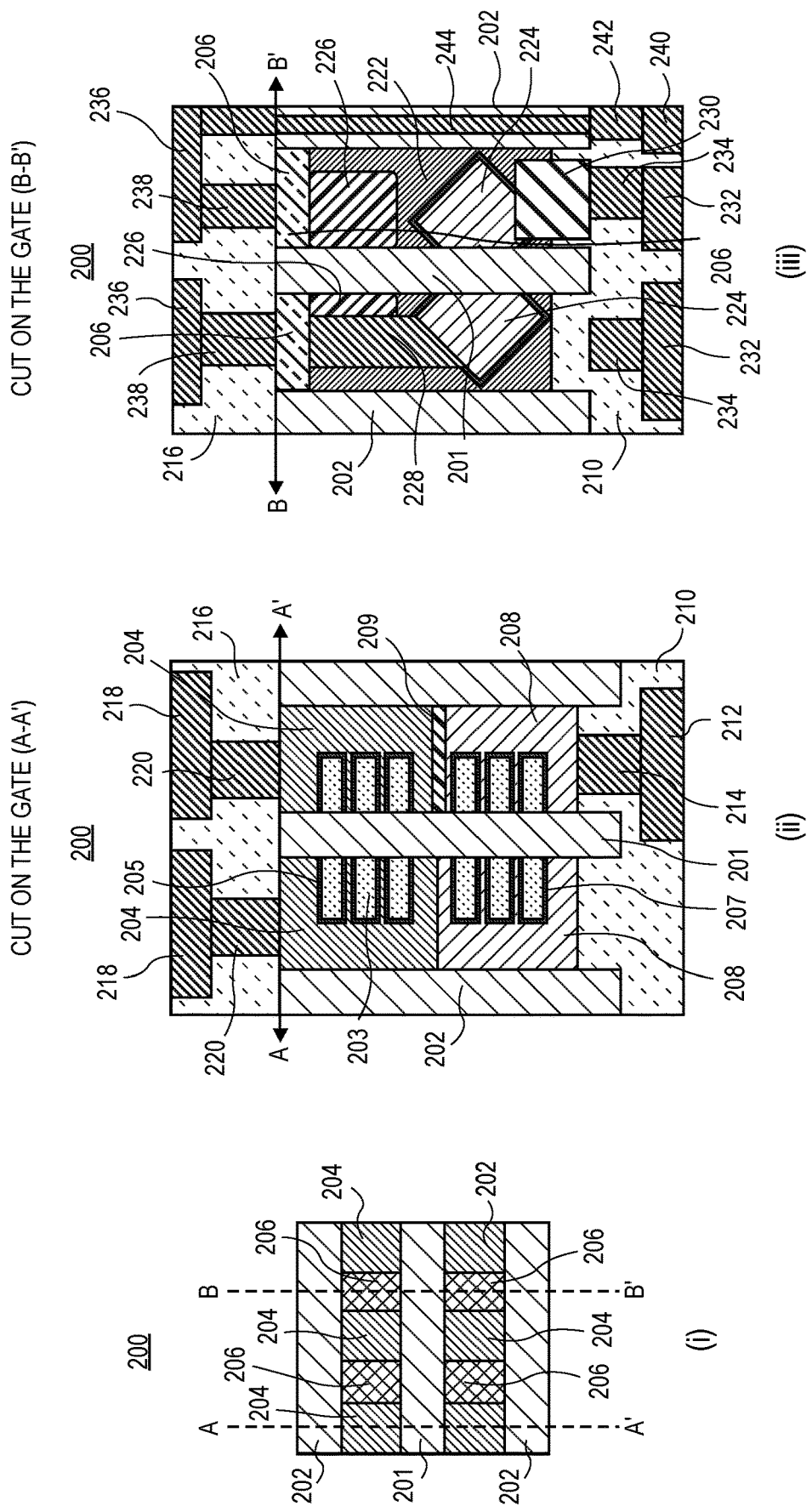
FIG. 2 illustrates a plan view and cross-sectional views of an integrated circuit structure including stacked forksheet transistors, in accordance with an embodiment of the present disclosure.

FIG. 2 illustrates a plan view (i) and cross-sectional views (ii) and (iii) of an integrated circuit structure including stacked forksheet transistors, in accordance with an embodiment of the present disclosure.

Referring to FIG. 2, an integrated circuit structure 200 includes a backbone 201, which may be a dielectric wall. Additional dielectric walls 202 may also be included. Nanowires or nanoribbons 203 are along edges of the backbone 201. Upper gate stacks including an upper gate electrode 204 and upper gate dielectric 205 surround upper ones of the nanowires or nanoribbons 203. Lower gate stacks including a lower gate electrode 208 and lower gate dielectric 207 surround lower ones of the nanowires or nanoribbons 203. In an embodiment, a dielectric layer 209 separates one of the upper gate stacks from a corresponding one of the lower gate stacks, as is depicted.

Upper source or drain structures 226 are included at ends of the nanowires or nanoribbons 203 surrounded by the upper gate stacks. In one embodiment, the upper source or drain structures 226 are N-type source or drain structures, such as epitaxial phosphorous-doped silicon source or drain structures. Lower source or drain structures 224 are included at ends of the nanowires or nanoribbons 203 surrounded by the lower gate stacks. In one embodiment, the lower source or drain structures 224 are P-type source or drain structures, such as epitaxial silicon germanium source or drain structures. It is to be appreciated that the upper and lower source or drain structure types may be reversed. The upper source or drain structures 226 and the lower source or drain structures 224 can be included in a dielectric layer 222. One or more upper source or drain contacts 206 can be included on the upper source or drain structures 226, as is depicted. One or more lower source or drain contacts 230 can be included on the lower source or drain structures 224, as is also depicted.

One or more upper vias 220 and corresponding lines 218 can be coupled to one or more of corresponding ones of the upper gate stacks and may be included in an inter-layer dielectric layer 216, as is depicted. One or more lower vias 214 and corresponding lines 212 can be coupled to one or more of corresponding ones of the upper gate stacks and may be included in an inter-layer dielectric layer 210, as is also depicted.

One or more upper vias 238 and corresponding lines 236 can be coupled to one or more of corresponding ones of the upper source or drain contacts 206 and may be included in the inter-layer dielectric layer 216, as is depicted. One or more lower vias 234 and corresponding lines 232 can be coupled to one or more of corresponding ones of the lower source or drain contacts 230 and may be included in the inter-layer dielectric layer 210, as is also depicted.

In an embodiment, one of the upper source or drain structures 226 is coupled to a corresponding one of the lower source or drain structures 228, as is depicted. In an embodiment, a through-wall via 244 enables front to back or back to front routing. For example, a backside metal line 240 and corresponding via 242 can be coupled to one of the metal lines 236 by the through-wall via 244, as is depicted.

With reference again to FIG. 2, in accordance with an embodiment of the present disclosure, an integrated circuit structure 200 includes a backbone 201. A first transistor device (e.g., lower left or lower right of part (ii)) includes a first vertical stack of semiconductor channels 203 adjacent to an edge of the backbone 201. A second transistor device (e.g., corresponding upper left or upper right of part (ii)) includes a second vertical stack of semiconductor channels 203 adjacent to the edge of the backbone 201. The second transistor device is stacked on the first transistor device.

In an embodiment, the first transistor device is a P-type device, and the second transistor device is an N-type device. In another embodiment, the first transistor device is an N-type device, and the second transistor device is a P-type device.

In an embodiment, the first and second vertical stacks of semiconductor channels 203 are first and second stacks of nanoribbons or nanowires. In an embodiment, a total number (e.g., 3) of semiconductor channels in the first vertical stack of semiconductor channels 203 is the same as a total number (e.g., 3) of semiconductor channels 203 in the second vertical stack of semiconductor channels. In another embodiment, not depicted, a total number of semiconductor channels 203 in the first vertical stack of semiconductor channels is different than a total number of semiconductor channels 203 in the second vertical stack of semiconductor channels.

In an embodiment, a first gate structure 207/208 is on the first vertical stack of semiconductor channels 203, the first gate structure including a first gate electrode 208 and a first gate dielectric 207. A second gate structure 204/205 on the second vertical stack of semiconductor channels 203, the second gate structure including a second gate electrode 204 and a second gate dielectric 205. In one embodiment, a second gate electrode (e.g., left 204 of part (ii)) is directly on a first gate electrode (e.g., left 208 of part (ii)). In one embodiment, a first gate electrode (e.g., right 208 of part (ii)) is separated from a second gate electrode (e.g., right 204 of part (ii)) by a dielectric layer 209.

With reference again to FIG. 2, in accordance with an embodiment of the present disclosure, an integrated circuit structure 200 includes a first transistor device (e.g., lower left of part (ii)) of a first conductivity type. A second transistor device (e.g., upper left of part (ii)) is stacked on the first transistor device, the second transistor device of a second conductivity type opposite the first conductivity type. A third transistor device (e.g., lower right of part (ii)) is laterally spaced apart from the first transistor device, the third transistor device of the first conductivity type. A fourth transistor device (e.g., upper right of part (ii)) is stacked on the third transistor device and is laterally spaced apart from the second transistor device, the fourth transistor device of the second conductivity type.

In an embodiment, the second transistor device (e.g., upper left of part (ii)) is directly on the first transistor device (e.g., lower left of part (ii)), as is depicted. The fourth transistor device (e.g., upper right of part (ii)) is spaced apart from the third transistor device (e.g., lower right of part (ii)) by a dielectric layer 209, as is also depicted. In an embodiment, the first conductivity type is P-type, and the second conductivity type is N-type device. In another embodiment, the first conductivity type is N-type, and the second conductivity type is P-type device.

In an embodiment, the first transistor device (e.g., lower left of part (ii)) is laterally spaced apart from the third transistor device (e.g., lower right of part (ii)) by a backbone 201. The second transistor device (e.g., lower right of part (ii)) is laterally spaced apart from the fourth transistor device (e.g., upper right of part (ii)) by the backbone 201. In an embodiment, the first, second, third and fourth transistor devices are each vertical stacks of nanoribbons or nanowires.

In accordance with an embodiment of the present disclosure, a process flow described below begins with Si/SiGe EPI dep. A self-aligned double patterning (SADP) or self-aligned quadruple patterning (SAQP) can be used to pattern and etch Si/SiGe fins. A dielectric material such as $SiO_2$, $Si_3N_4$, $HfO_2$, $Al_2O_3$ can be filled and etched to form a self-aligned dielectric wall. The dielectric wall can be parallel or perpendicular to the fins. Depending on the technique to build the self-aligned dielectric wall, the dielectric wall may consist of more than one material, or have different wall materials at different fin pitch, or have different liner around the wall. The substrate can be a bulk Si wafer or an SOI substrate or a double SOI substrate.

After fin patterning and wall formation, a dummy poly Si gate is fabricated. After poly gate patterning, a gate spacer is deposited and etched to separate gates and contacts. The internal spacer is made using an isotropic SiGe etch and followed by filling a dielectric material between the ribbons. In one embodiment, P-EPI SiGe S/D is selectively grown on the lower ribbons for PMOS and N-EPI Si:P S/D on the upper ribbons for NMOS. A separation oxide can be included between the N-EPI S/D and P-EPI S/D to prevent N-EPI from being contact with P-EPI. An interlayer dielectric (ILD) is then filled into S/D regions. It is to be appreciated that NMOS on PMOS is shown here as an example, and that a vice versa arrangement can instead be fabricated. Also, in some CMOS circuitry, only a single type of MOS, either NMOS or PMOS, is needed. Therefore, the dual EPI might not be needed in some circuits.

After a dual EPI process, the poly gate is removed and the ribbons are released by selectively SiGe etch. A high-k gate dielectric is then deposited on the nanoribbons. P-type workfunction metal (P-WFM) is deposited on the lower ribbons and N-type workfunction metal (N-WFM) on the upper ribbons. In one case, the N-WFM and P-WFM are connected to form a shared gate device (i.e. common gate). In another case, an isolation oxide can be deposited to separate P-WFM and N-WFM. In some CMOS circuitry, only single type of MOS, either NMOS or PMOS, is needed. Therefore, the dual metal gate might not be needed in some circuits. Also, the upper Si ribbons or lower Si ribbons might be selectively removed to make a single type of MOS transistor.

After filling high-k and metal gate, a contact trench can be etched and filled by contact metal. In some locations, an N-P via can be etched to connect N-EPI to P-EPI and form a common drain for NMOS and PMOS, for example, an output of an inverter. After front end processing, the front side back-end interconnect can be made to route the circuitry. There can be 2 to about 15 metal/via layers on the front side of the wafer. One important feature here is that the routing can run through the dielectric wall to connect front side interconnect to the backside interconnect.

After front side processing, the device wafer can be bonded to a carrier wafer, and the device wafer can be flipped, grinded and polished. The remaining Si sub-fins and STI oxide can be removed and filled with insulating oxide layer. The backside interconnect can be built to route the circuitry as well. There can be 1 to about 5 metal/via layers on the backside of the wafer. The backside contact can be formed to connect to the bottom EPI (p-EPI in this case), allowing power delivery from the backside of the wafer. The backside interconnect can also have vias to connect to the gate, especially for the devices with the isolation oxide between P-WFM and N-WFM. Also, the backside via/metal line can route through the dielectric wall to communicate with the front side interconnect.

FIGS. 3-8 illustrate cross-sectional views of various operations in a method of fabricating an integrated circuit structure including stacked forksheet transistors, in accordance with an embodiment of the present disclosure.

Figure 3:
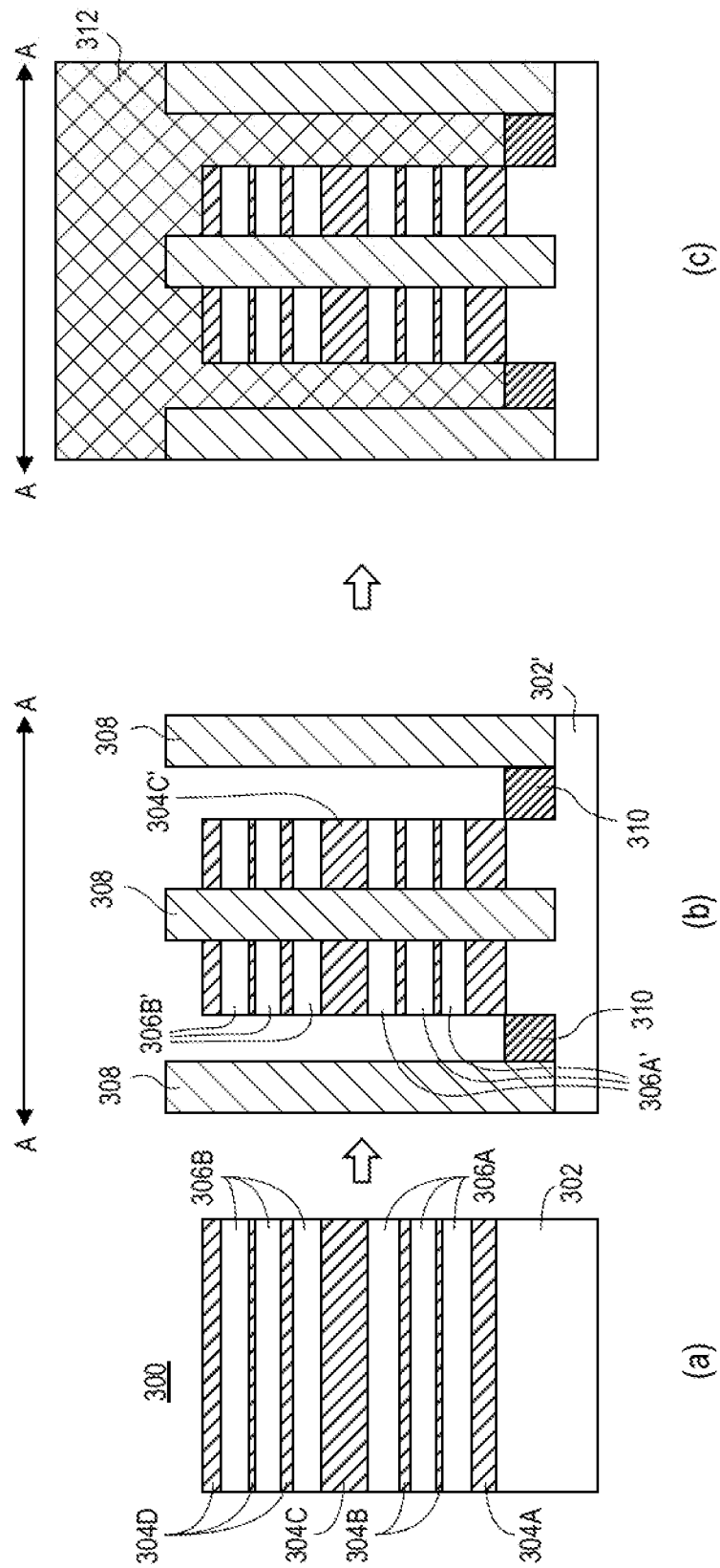
FIGS. 3-8 illustrate cross-sectional views of various operations in a method of fabricating an integrated circuit structure including stacked forksheet transistors, in accordance with an embodiment of the present disclosure.

Referring to part (a) of FIG. 3, a starting stack 300 includes a silicon substrate 302, lower nanowire or nanoribbon layers 306A, upper nanowire or nanoribbon layers 306B, a lower silicon germanium release layer 304A, lower intervening silicon germanium release layers 304B, an intermediate silicon germanium release layer 304C, and an upper silicon germanium release layer 304D.

Referring to part (b) of FIG. 3, the starting stack 300 is patterned to include, inter alia, patterned substrate 302', patterned lower nanowire or nanoribbon layers 306A', patterned upper nanowire or nanoribbon layers 306B', and patterned intermediate silicon germanium release layer 304C'. Dielectric walls 308 and shallow trench isolation (STI) structures 310 are formed within the resulting structure. The central dielectric wall 308 may be referred to as a backbone. A dummy gate structure 312, such as a polysilicon gate structure, is formed on the structure of part (b) of FIG. 3, as is depicted in part (c) of FIG. 3.

Figure 4:
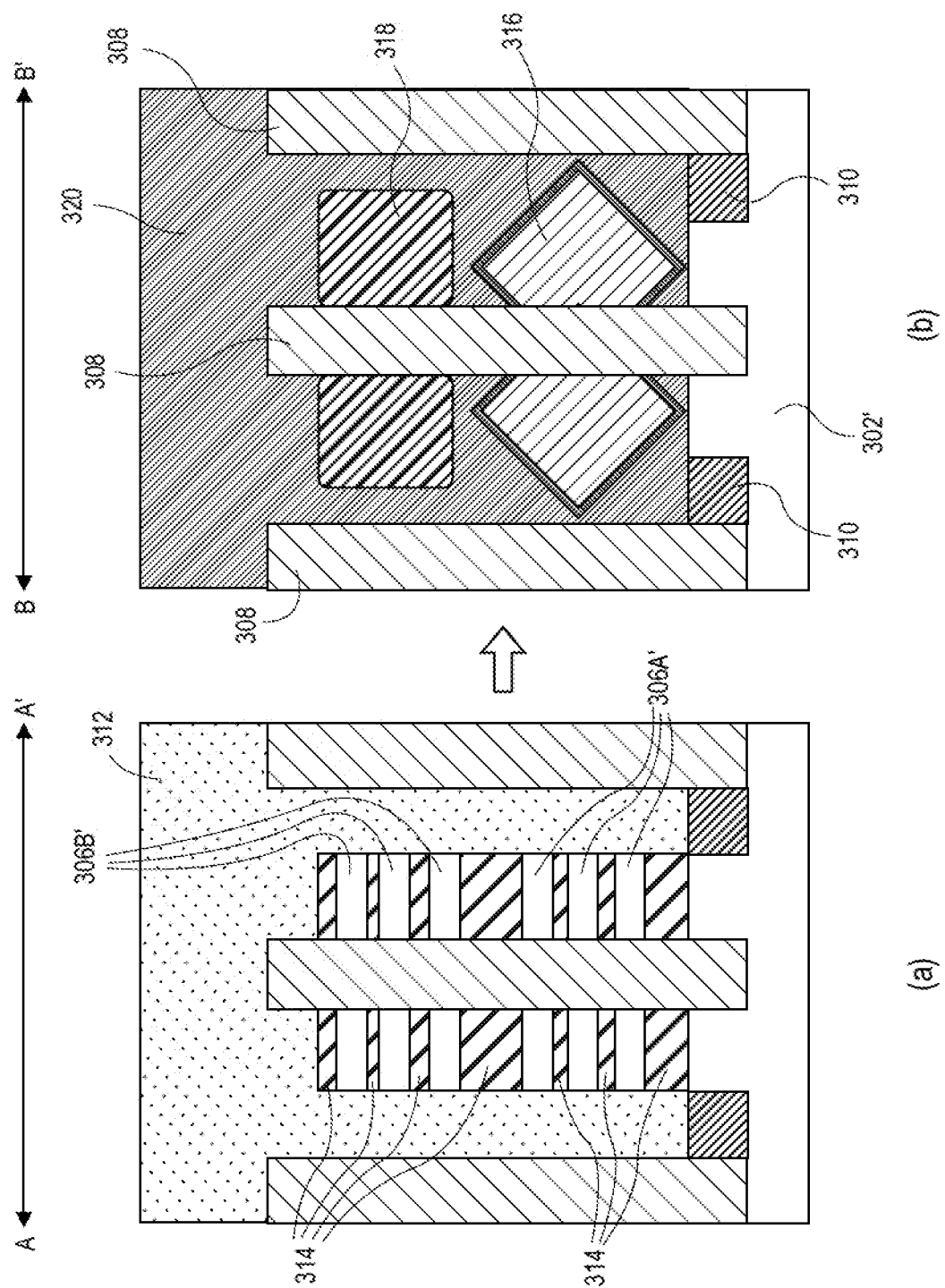

Referring to part (a) of FIG. 4, in the gate location, the patterned silicon germanium layers are replaced with a dielectric layer 314. This may be performed through the source or drain regions which provide access under the dummy gate 312. Referring to part (b) of FIG. 4, in the source or drain locations, the nanowire or nanoribbon portions are removed in those locations. Lower source or drain structures 316, such as epitaxial silicon germanium source or drain structures, are formed at ends of the patterned lower nanowire or nanoribbon layers 306A'. Upper source or drain structures 318, such as epitaxial phosphorous-doped silicon source or drain structures, are formed at ends of the patterned upper nanowire or nanoribbon layers 306B'. An inter-layer dielectric layer 320 is then formed over the resulting structure, as is depicted.

Figure 5:
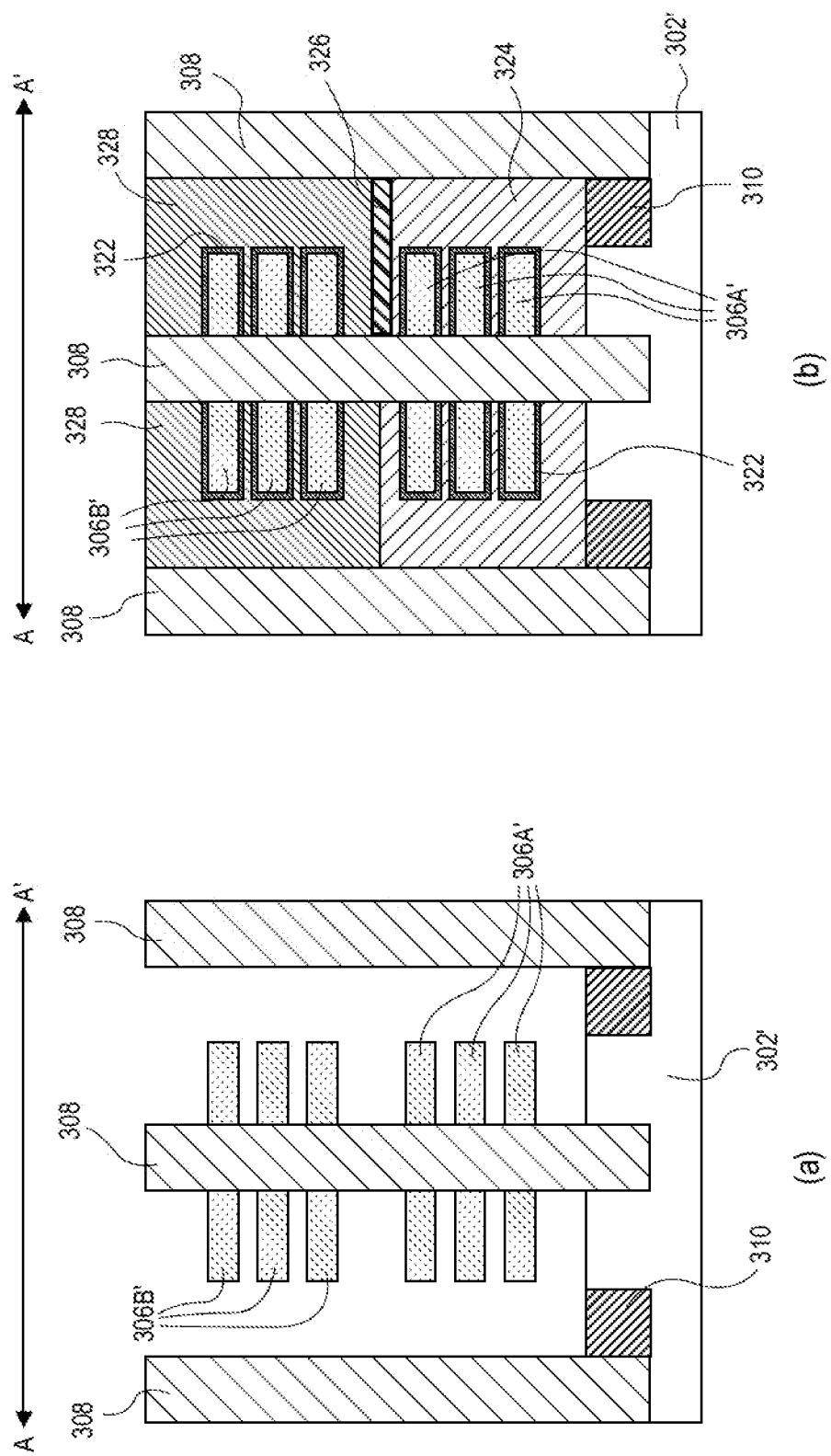

Referring to part (a) of FIG. 5, in the gate location, the dummy gate structure 312 and the dielectric layer 314 are removed. Referring to part (b) of FIG. 5, in the gate location, a gate dielectric 322 layer is formed. A lower gate electrode 324 and an upper gate electrode 328 are then formed. For the left-hand side structures, the upper gate electrode 328 is formed directly on the lower gate electrode 324. For the right-hand side structures, the upper gate electrode 328 is separated from the lower gate electrode 324 by a dielectric layer 326.

Figure 6:
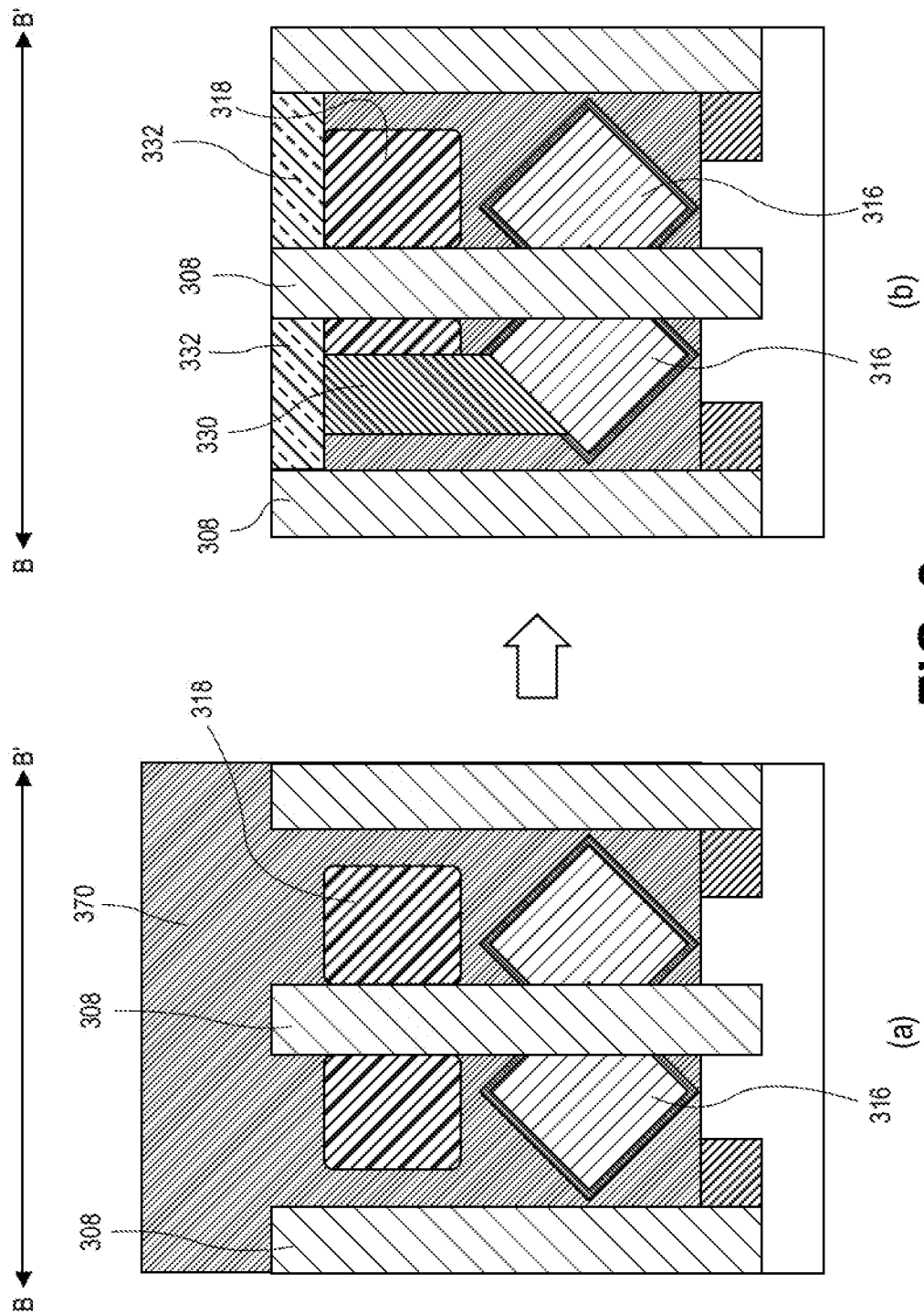

Referring to part (a) of FIG. 6, in the source or drain locations, the structure of part (b) of FIG. 4 is provided. Referring to part (b) of FIG. 6, in the source or drain locations, a via structure 330 is formed as a contact between a left-hand side upper source or drain structure 318 and a corresponding left-hand side lower source or drain structure 316. Upper source or drain contacts are then formed on the upper source or drain structures 318.

Figure 7:
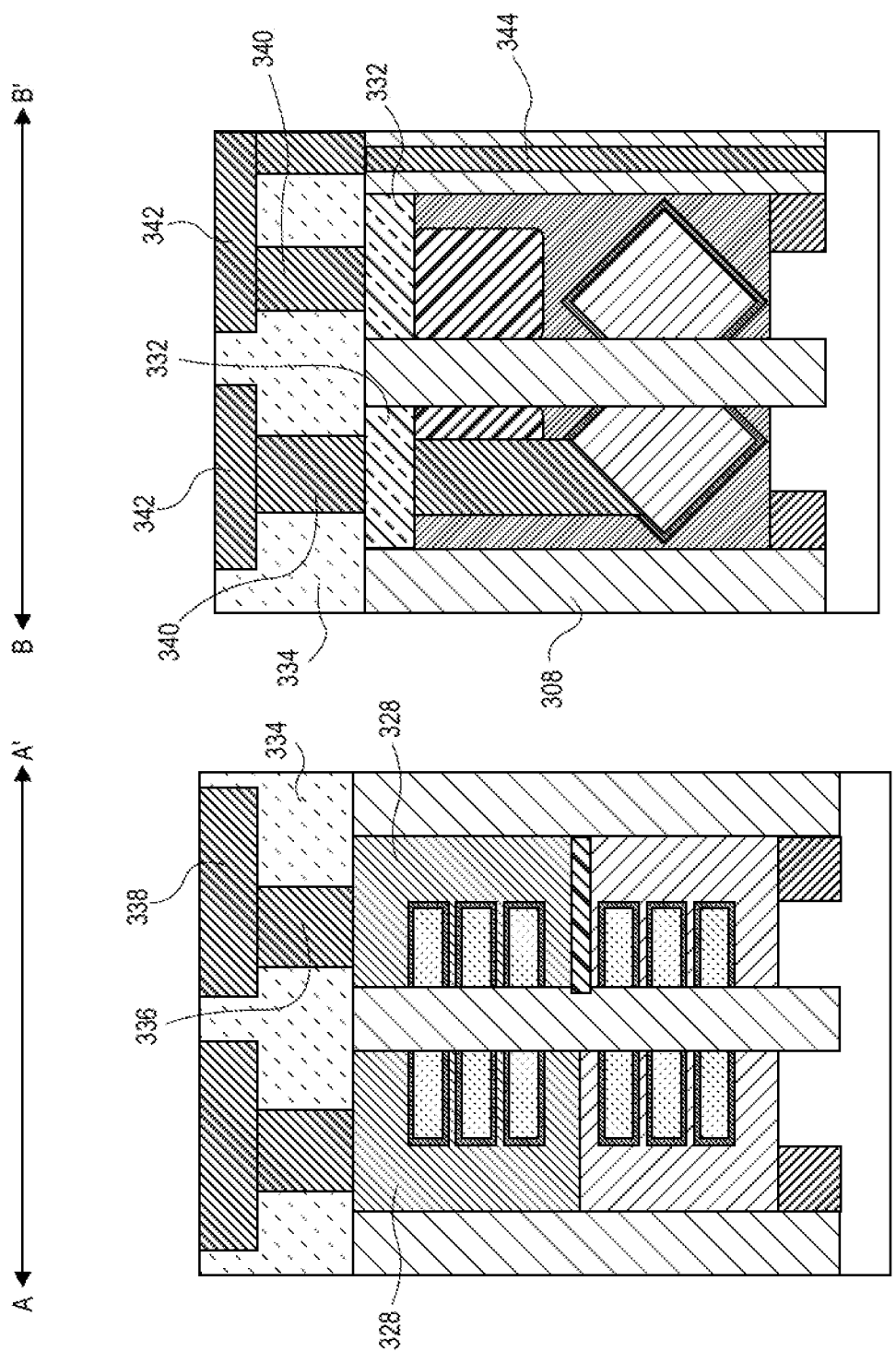

Referring to part (a) of FIG. 7, in the gate location, conductive vias 336 and corresponding conductive lines 338 are formed to contact corresponding upper gate electrodes 328 in an inter-layer dielectric layer 334. Referring to part (b) of FIG. 7, in the source or drain locations, conductive vias 340 and corresponding conductive lines 342 are formed to contact corresponding upper source or drain contacts 332 in the inter-layer dielectric layer 334.

Figure 8:
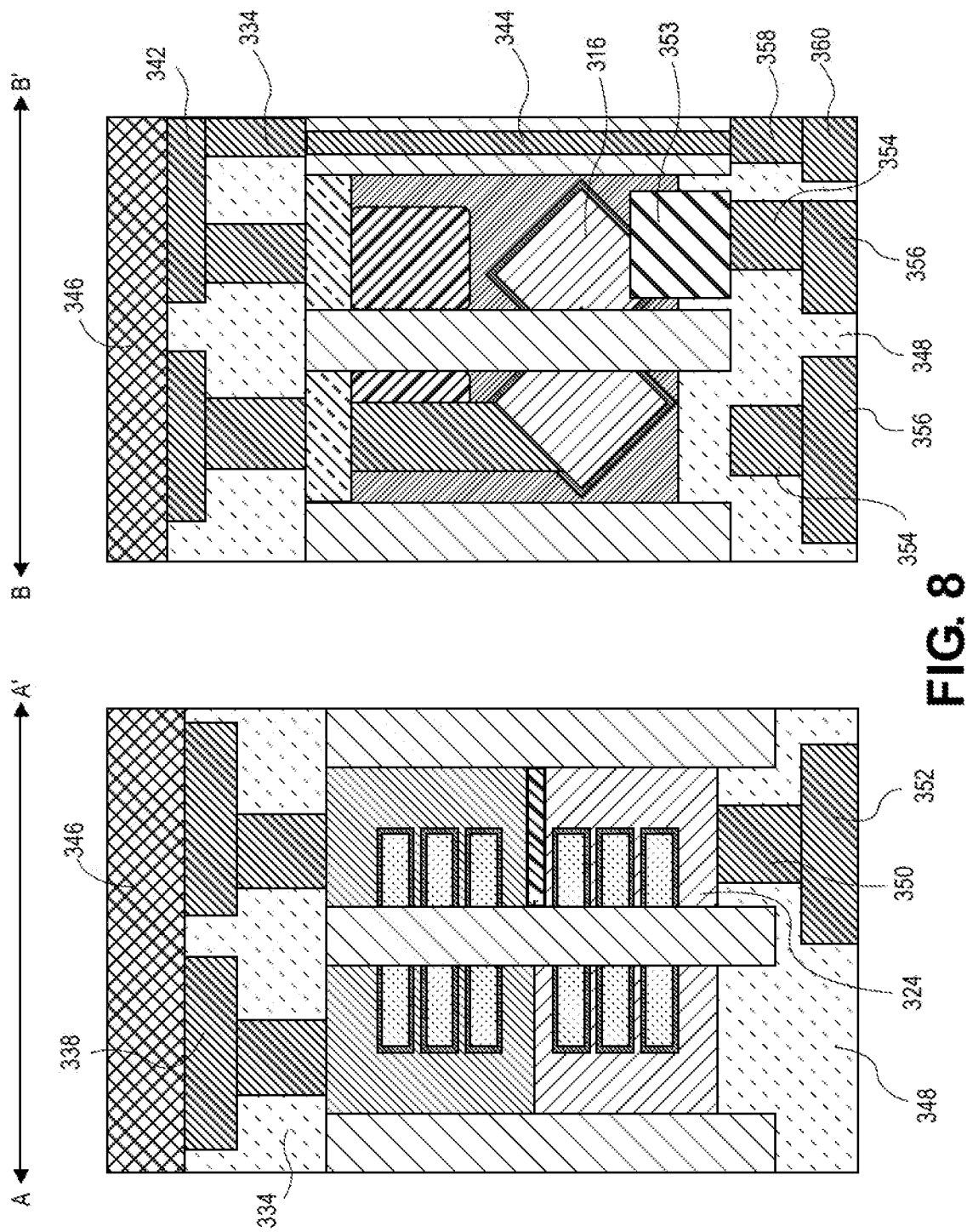

Referring to FIG. 8, the structure of FIG. 7 is placed on a carrier wafer 346 to enable backside processing. Referring to part (a) of FIG. 8, in the gate location, a conductive vias 350 and corresponding conductive line 352 is formed to contact a corresponding lower gate electrode 324 in an inter-layer dielectric layer 348. Referring to part (b) of FIG. 8, in the source or drain locations, one or more lower source or drain contacts 353 is formed. Conductive vias 354 and corresponding conductive lines 356 are then formed in the inter-layer dielectric layer 348. A through-wall via 344 is formed in one of the dielectric walls 308 for front to back or back to front routing. For example, a backside metal line 360 and corresponding via 352 can be coupled to one of the metal lines 342 by the through-wall via 344, as is depicted.

In an embodiment, an underlying semiconductor substrate as described herein represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

It is to be appreciated that, in a particular embodiment, channel layers (or corresponding release layers) of a plurality of nanowires (or nanoribbons) may be composed of silicon. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is to be appreciated that, in a particular embodiment, channel layers (or corresponding release layers) of a plurality of nanowires (or nanoribbons) may be composed of silicon germanium. As used throughout, a silicon germanium layer may be used to describe a silicon germanium material composed of substantial portions of both silicon and germanium, such as at least 5% of both. In some embodiments, the (atomic) amount of germanium is the same or substantially the same as the amount of silicon (e.g., $Si_{50}Ge_{50}$). In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

It is to be appreciated that, in a particular embodiment, channel layers (or corresponding release layers) of a plurality of nanowires (or nanoribbons) may be composed of germanium. As used throughout, a germanium layer may be used to describe a germanium material composed of a very substantial amount of, if not all, germanium. However, it is to be appreciated that, practically, 100% pure Ge may be difficult to form and, hence, could include a tiny percentage of carbon, silicon or tin. Such impurities may be included as an unavoidable impurity or component during deposition of Ge or may "contaminate" the Ge upon diffusion during post deposition processing. As such, embodiments described herein directed to a germanium layer may include a germanium layer that contains a relatively small amount, e.g., "impurity" level, non-Ge atoms or species, such as Si, C or Sn. It is to be appreciated that a germanium layer as described herein may be undoped or may be doped with dopant atoms such as boron, phosphorous or arsenic.

It is to be appreciated that although some embodiments describe the use of Si or SiGe (wire or ribbon) and complementary Si or SiGe (sacrificial) layers, other pairs of semiconductor materials which can be alloyed and grown epitaxially could be implemented to achieve various embodiments herein, for example, InAs and InGaAs.

In an embodiment, source or drain structures are fabricated from silicon alloy formed using a selective epitaxial deposition process. In some implementations, the silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum.

In an embodiment, dielectric spacers may separate a gate electrode from source or drain structures. The nanowire channels may pass through the spacers to connect to the source or drain structures on either side of the nanowire channels. In an embodiment, a gate dielectric surrounds the perimeter of exposed portions of the nanowire or nanoribbon channels. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

In an embodiment, a gate electrode surrounds the gate dielectric layer. It is to be appreciated that a gate electrode may include a workfunction metal over the gate dielectric layer and a gate fill metal. When the workfunction metal will serve as an N-type workfunction metal, the workfunction metal of the gate electrode preferably has a workfunction that is between about 3.9 eV and about 4.2 eV. N-type materials that may be used to form the metal of the gate electrode include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal will serve as a P-type workfunction metal, workfunction metal of the gate electrode preferable has a workfunction that is between about 4.9 eV and about 5.2 eV. P-type materials that may be used to form the metal of the gate electrode include, but are not limited to, ruthenium, palladium, platinum, cobalt, nickel, and conductive metal oxides, e.g., ruthenium oxide.

In the illustrated embodiment, each distinct transistor is shown as having three nanowire or nanoribbon channels. However, it is to be appreciated that each transistor may include any number of nanowire or nanoribbon channels in accordance with various embodiments.

In one aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional through-Silicon via TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch process. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch process may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

Figure 9:
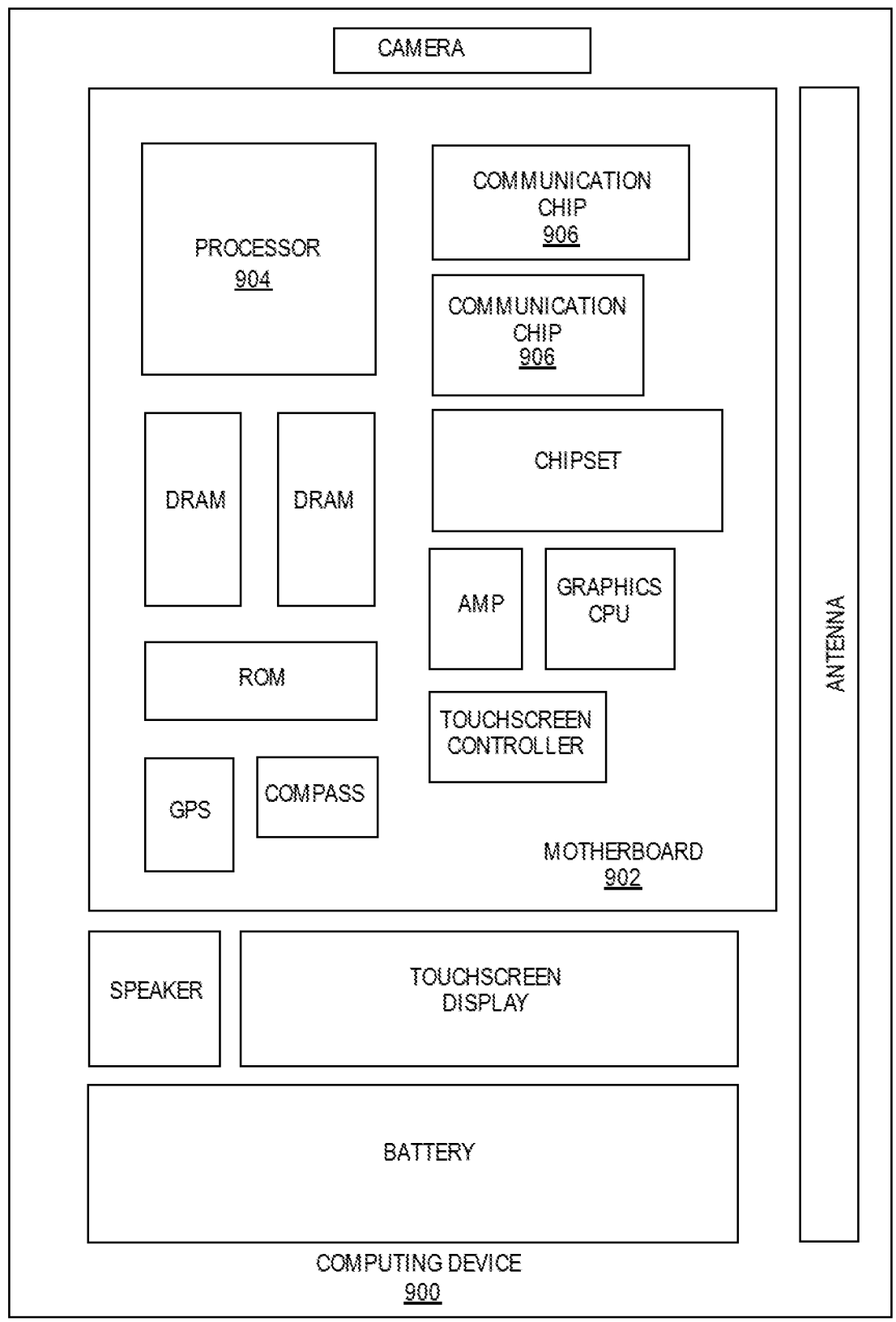
FIG. 9 illustrates a computing device in accordance with one implementation of an embodiment of the disclosure.

FIG. 9 illustrates a computing device 900 in accordance with one implementation of an embodiment of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In an embodiment, the integrated circuit die of the processor 904 may include stacked forksheet transistors, such as those described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In an embodiment, the integrated circuit die of the communication chip 906 may include stacked forksheet transistors, such as those described herein.

In further implementations, another component housed within the computing device 900 may include stacked forksheet transistors, such as those described herein.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
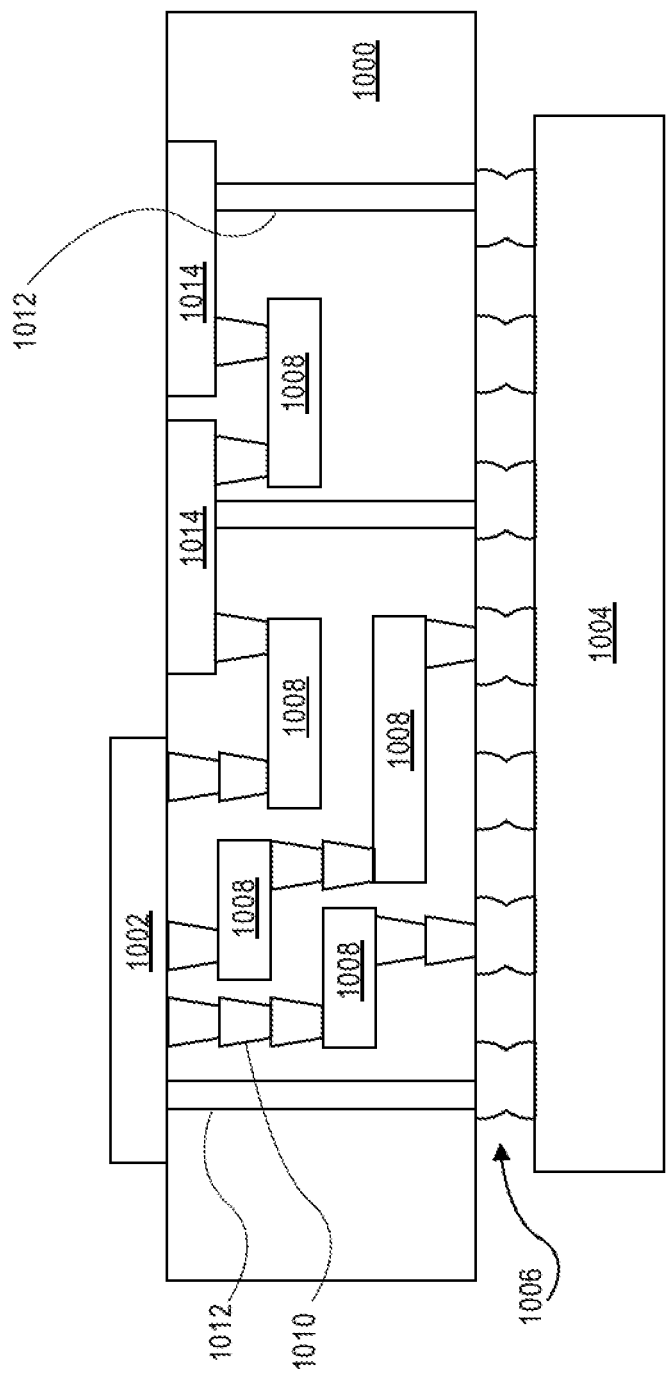
FIG. 10 is an interposer implementing one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. In an embodiment, one of both of the first substrate 1002 and the second substrate 1004 may include stacked forksheet transistors, in accordance with embodiments described herein. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000.

Thus, embodiments of the present disclosure may include stacked forksheet transistors, and methods of fabricating stacked forksheet transistors.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a backbone. A first transistor device includes a first vertical stack of semiconductor channels adjacent to an edge of the backbone. A second transistor device includes a second vertical stack of semiconductor channels adjacent to the edge of the backbone. The second transistor device is stacked on the first transistor device.

Example embodiment 2: The integrated circuit structure of example embodiment 1, wherein the first transistor device is a P-type device, and the second transistor device is an N-type device.

Example embodiment 3: The integrated circuit structure of example embodiment 1, wherein the first transistor device is an N-type device, and the second transistor device is a P-type device.

Example embodiment 4: The integrated circuit structure of example embodiment 1, 2 or 3, wherein the first and second vertical stacks of semiconductor channels are first and second stacks of nanoribbons or nanowires.

Example embodiment 5: The integrated circuit structure of example embodiment 1, 2, 3 or 4, wherein a total number of semiconductor channels in the first vertical stack of semiconductor channels is the same as a total number of semiconductor channels in the second vertical stack of semiconductor channels.

Example embodiment 6: The integrated circuit structure of example embodiment 1, 2, 3 or 4, wherein a total number of semiconductor channels in the first vertical stack of semiconductor channels is different than a total number of semiconductor channels in the second vertical stack of semiconductor channels.

Example embodiment 7: The integrated circuit structure of example embodiment 1, 2, 3, 4, 5 or 6, further including a first gate structure on the first vertical stack of semiconductor channels, the first gate structure including a first gate electrode and a first gate dielectric, and a second gate structure on the second vertical stack of semiconductor channels, the second gate structure including a second gate electrode and a second gate dielectric.

Example embodiment 8: The integrated circuit structure of example embodiment 7, wherein the second gate electrode is directly on the first gate electrode.

Example embodiment 9: The integrated circuit structure of example embodiment 7, wherein the first gate electrode is separated from the second gate electrode by a dielectric layer.

Example embodiment 10: An integrated circuit structure includes a first transistor device of a first conductivity type. A second transistor device is stacked on the first transistor device, the second transistor device of a second conductivity type opposite the first conductivity type. A third transistor device is laterally spaced apart from the first transistor device, the third transistor device of the first conductivity type. A fourth transistor device is stacked on the third transistor device and is laterally spaced apart from the second transistor device, the fourth transistor device of the second conductivity type.

Example embodiment 11: The integrated circuit structure of example embodiment 10, wherein the second transistor device is directly on the first transistor device, and wherein the fourth transistor device is spaced apart from the third transistor device by a dielectric layer.

Example embodiment 12: The integrated circuit structure of example embodiment 10 or 11, wherein the first transistor device is laterally spaced apart from the third transistor device by a backbone, and wherein the second transistor device is laterally spaced apart from the fourth transistor device by the backbone.

Example embodiment 13: The integrated circuit structure of example embodiment 10, 11 or 12, wherein the first conductivity type is P-type, and the second conductivity type is N-type device.

Example embodiment 14: The integrated circuit structure of example embodiment 10, 11 or 12, wherein the first conductivity type is N-type, and the second conductivity type is P-type device.

Example embodiment 15: The integrated circuit structure of example embodiment 10, 11, 12, 13 or 14, wherein the first, second, third and fourth transistor devices are each vertical stacks of nanoribbons or nanowires.

Example embodiment 16: A computing device includes a board, and a component coupled to the board. The component includes an integrated circuit structure including a backbone. A first transistor device includes a first vertical stack of semiconductor channels adjacent to an edge of the backbone. A second transistor device includes a second vertical stack of semiconductor channels adjacent to the edge of the backbone. The second transistor device is stacked on the first transistor device.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a camera coupled to the board.

Example embodiment 20: The computing device of example embodiment 16, 17, 18 or 19, further including a battery coupled to the board.

Example embodiment 21: The computing device of example embodiment 16, 17, 18, 19 or 20, further including an antenna coupled to the board.

Example embodiment 22: The computing device of example embodiment 16, 17, 18, 19, 20 or 21, wherein the component is a packaged integrated circuit die.

Example embodiment 23: The computing device of example embodiment 16, 17, 18, 19, 20, 21 or 22, wherein the component is selected from the group consisting of a processor, a communications chip, and a digital signal processor.

What is claimed is:

1. An integrated circuit structure, comprising:
    a backbone;
    a first transistor device comprising a first vertical stack of semiconductor channels adjacent to an edge of the backbone; and
    a second transistor device comprising a second vertical stack of semiconductor channels adjacent to the edge of the backbone, the second transistor device stacked on the first transistor device.

2. The integrated circuit structure of claim 1, wherein the first transistor device is a P-type device, and the second transistor device is an N-type device.

3. The integrated circuit structure of claim 1, wherein the first transistor device is an N-type device, and the second transistor device is a P-type device.

4. The integrated circuit structure of claim 1, wherein the first and second vertical stacks of semiconductor channels are first and second stacks of nanoribbons or nanowires.

5. The integrated circuit structure of claim 1, wherein a total number of semiconductor channels in the first vertical stack of semiconductor channels is the same as a total number of semiconductor channels in the second vertical stack of semiconductor channels.

6. The integrated circuit structure of claim 1, wherein a total number of semiconductor channels in the first vertical stack of semiconductor channels is different than a total number of semiconductor channels in the second vertical stack of semiconductor channels.

7. The integrated circuit structure of claim 1, further comprising:
    a first gate structure on the first vertical stack of semiconductor channels, the first gate structure comprising a first gate electrode and a first gate dielectric; and
    a second gate structure on the second vertical stack of semiconductor channels, the second gate structure comprising a second gate electrode and a second gate dielectric.

8. The integrated circuit structure of claim 7, wherein the second gate electrode is directly on the first gate electrode.

9. The integrated circuit structure of claim 7, wherein the first gate electrode is separated from the second gate electrode by a dielectric layer.

10. An integrated circuit structure, comprising:
a first transistor device of a first conductivity type;
a second transistor device stacked on the first transistor device, the second transistor device of a second conductivity type opposite the first conductivity type;
a third transistor device laterally spaced apart from the first transistor device, the third transistor device of the first conductivity type; and
a fourth transistor device stacked on the third transistor device and laterally spaced apart from the second transistor device, the fourth transistor device of the second conductivity type, wherein the first transistor device is laterally spaced apart from the third transistor device by a backbone, wherein the second transistor device is laterally spaced apart from the fourth transistor device by the backbone, and wherein the backbone is a dielectric backbone.

11. The integrated circuit structure of claim 10, wherein the first conductivity type is P-type, and the second conductivity type is N-type device.

12. The integrated circuit structure of claim 10, wherein the first conductivity type is N-type, and the second conductivity type is P-type device.

13. The integrated circuit structure of claim 10, wherein the first, second, third and fourth transistor devices are each vertical stacks of nanoribbons or nanowires.

14. A computing device, comprising:
a board; and
a component coupled to the board, the component including an integrated circuit structure, comprising:
a backbone;
a first transistor device comprising a first vertical stack of semiconductor channels adjacent to an edge of the backbone; and
a second transistor device comprising a second vertical stack of semiconductor channels adjacent to the edge of the backbone, the second transistor device stacked on the first transistor device.

15. The computing device of claim 14, further comprising:
a memory coupled to the board.

16. The computing device of claim 14, further comprising:
a communication chip coupled to the board.

17. The computing device of claim 14, further comprising:
a camera coupled to the board.

18. The computing device of claim 14, further comprising:
a battery coupled to the board.

19. The computing device of claim 14, further comprising:
an antenna coupled to the board.

20. The computing device of claim 14, wherein the component is a packaged integrated circuit die.

21. The computing device of claim 14, wherein the component is selected from the group consisting of a processor, a communications chip, and a digital signal processor.

* * * * *